United States Patent
Kim

(10) Patent No.: US 10,930,712 B2
(45) Date of Patent: Feb. 23, 2021

(54) IRREGULARLY-SHAPED FLAT-PANEL DISPLAY HAVING IRREGULARLY-SHAPED PIXELS

(71) Applicant: LG DISPLAY CO., LTD., Seoul (KR)

(72) Inventor: Taehan Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/224,451

(22) Filed: Dec. 18, 2018

(65) Prior Publication Data

US 2019/0198581 A1  Jun. 27, 2019

(30) Foreign Application Priority Data

Dec. 22, 2017 (KR) .......................... 10-2017-0178014

(51) Int. Cl.
| | |
|---|---|
| H01L 27/32 | (2006.01) |
| H01L 51/00 | (2006.01) |
| G02F 1/13 | (2006.01) |
| G02F 1/1333 | (2006.01) |
| G02F 1/1362 | (2006.01) |

(52) U.S. Cl.
CPC .......... *H01L 27/3218* (2013.01); *G02F 1/13* (2013.01); *H01L 27/3213* (2013.01); *H01L 27/3216* (2013.01); *H01L 51/0096* (2013.01); *G02F 1/1362* (2013.01); *G02F 2001/133388* (2013.01); *G02F 2201/52* (2013.01); *G02F 2201/56* (2013.01); *G09G 2300/0465* (2013.01); *H01L 27/3244* (2013.01)

(58) Field of Classification Search
CPC ............ H01L 27/3216; H01L 27/3218; G02F 2201/52; G02F 2201/56; G02F 2001/133388; G09G 2300/0465
See application file for complete search history.

(56) References Cited

U.S. PATENT DOCUMENTS

| | | | | |
|---|---|---|---|---|
| 10,153,331 | B1* | 12/2018 | Jun ..................... | H01L 27/3218 |
| 2009/0309813 | A1* | 12/2009 | Fujita ................ | G02F 1/133512 |
| | | | | 345/55 |
| 2010/0020277 | A1* | 1/2010 | Morita .............. | G02F 1/133512 |
| | | | | 349/110 |
| 2010/0214195 | A1* | 8/2010 | Ogasawara ....... | G02F 1/136286 |
| | | | | 345/55 |
| 2010/0289994 | A1* | 11/2010 | Nonaka ............. | G02F 1/133514 |
| | | | | 349/108 |

(Continued)

FOREIGN PATENT DOCUMENTS

| | | | |
|---|---|---|---|
| CN | 205334901 U | * | 6/2016 |
| KR | 10-2011-0070169 A | | 6/2011 |
| KR | 10-2016-0083793 A | | 7/2016 |

*Primary Examiner* — Yu Chen
(74) *Attorney, Agent, or Firm* — Birch, Stewart, Kolasch & Birch, LLP

(57) ABSTRACT

The present disclosure relates to an irregularly-shaped display having irregularly-shaped pixels. The irregularly-shaped flat-panel display comprises a substrate, irregularly-shaped unit pixels, and regularly-shaped unit pixels. The substrate has an outer boundary line, at least one side of which is not a vertical or horizontal line. The irregularly-shaped unit pixels are arranged along the at least one side of the outer boundary line on the substrate. The regularly-shaped unit pixels are placed on the substrate, apart from the at least one side of the outer boundary line.

8 Claims, 4 Drawing Sheets

(56) References Cited

U.S. PATENT DOCUMENTS

| | | | | |
|---|---|---|---|---|
| 2016/0120005 | A1* | 4/2016 | Wu | H05B 33/26 |
| | | | | 313/505 |
| 2017/0278906 | A1* | 9/2017 | Song | H01L 27/326 |
| 2018/0107079 | A1* | 4/2018 | Tae | G02F 1/134309 |
| 2019/0073968 | A1* | 3/2019 | Tominaga | G09G 3/3607 |
| 2019/0164510 | A1* | 5/2019 | Fang | G02F 1/13306 |

* cited by examiner

IRREGULARLY-SHAPED FLAT-PANEL DISPLAY HAVING IRREGULARLY-SHAPED PIXELS

This application claims the priority benefit of Korean Patent Application No. 10-2017-0178014 filed on Dec. 22, 2017 in the Republic of Korea, which is incorporated herein by reference for all purposes as if fully set forth herein.

BACKGROUND OF THE DISCLOSURE

Field of the Disclosure

The present disclosure relates to an irregularly-shaped display having irregularly-shaped pixels. More particularly, the disclosure relates to an irregularly-shaped display that has pixels of different shapes to form a variety of planar shapes, such as circular, elliptical, diamond-shaped, trapezoidal, and/or cloud-shaped, rather than conventional rectangular shapes.

Related Art

In the field of display devices, flat-panel display devices (FPDs), which are thin and lightweight and have a large surface area, have been rapidly replacing bulky cathode ray tubes (CRTs). The flat-panel display devices include liquid-crystal display devices (LCDs), plasma display panels (PDPs), organic light-emitting display devices (OLEDs), electrophoretic display devices (EDs), etc.

Liquid-crystal displays, organic light-emitting diode displays, and electrophoretic display devices that are driven as active-matrix type comprise a thin-film transistor substrate with thin-film transistors assigned to pixel regions arranged in a matrix. A liquid-crystal display device (LCD) displays an image by adjusting light transmittance of liquid crystals using an electric field. An organic light-emitting diode display displays an image with organic light-emitting elements in pixels arranged in a matrix.

These flat-panel displays are usually made in rectangular shapes. That is, they take on the shape of a four-sided rectangle or square in which each pair of opposite sides is parallel. For example, as shown in FIG. 1, a typical flat-panel display has a rectangular exterior appearance according to a related art. FIG. 1 is a plan view of a structure of a corner portion of the typical rectangular flat-panel display.

Referring to FIG. 1, rectangular unit pixels UP are arranged in a matrix on a rectangular substrate SUB. Each unit pixel UP comprises a plurality of subpixels SP. To produce three primary colors—red, green, and blue—for a full-color representation, each unit pixel UP can be made up of a red subpixel R, a green subpixel G, and a blue subpixel B.

As the range of display applications expands, the demand for display devices of different shapes other than rectangles is increasing. For example, organic-light emitting diode displays that are thin-film type and offer low energy consumption and high brightness are growing in demand for use in display devices that comes in a variety of outline shapes, such as the traditional circular or elliptical shape, as in wall clocks, wristwatches, or cars' dashboards, or even a cloud shape.

In order that a flat-panel display, such as a liquid-crystal display or organic light-emitting diode display, is used as a display device whose outline takes on a free-form shape, the outline should be round. For example, as shown in FIG. 2, unit pixels UP are arranged to have the same pixel structure as in the related art, with a roughly round outline. FIG. 2 is a plan view of a structure of an edge portion of a circular display having an array of pixels according to the related art.

Referring to FIG. 2, a description will be given of a structure of a circular display, which is an example of a display device whose outline takes on a free-form shape. The circular display has a circular disk-shaped substrate SUB. Rectangular unit pixels UP are arranged in a matrix on the disk-shaped substrate SUB. Particularly, a round edge portion, where unit pixels UP are arranged in a staircase pattern along the outline of the disk-shaped substrate SUB, does not conform to the exact outline of the disk-shaped substrate SUB. That is, an empty space DZ, also known as a dead zone, is created between the outermost unit pixels UP and the substrate SUB, where there are no pixels, which can be a problem.

The smaller the area of the empty space DZ, the more the substrate SUB looks circular. The size of the unit pixels UP can be reduced to decrease the empty space DZ. However, there are physical limitations to reducing the unit pixels UP. Thus, it is necessary to develop a flat-panel display with a modified unit pixel structure to give it a certain shape other than the traditional rectangular shapes.

SUMMARY OF THE DISCLOSURE

The disclosure has been made in an effort to overcome or address the aforementioned problems associated with the related art, and an aspect of the disclosure is to provide an irregularly-shaped flat-panel display that takes on a free-form shape. Another aspect of the disclosure is to provide an irregularly-shaped flat-panel display that takes on a free-form shape using irregularly-shaped unit pixels and has no problems like a staircase pattern, blur, or a moire pattern on a non-perpendicular outer boundary line.

An embodiment of the disclosure provides an irregularly-shaped flat-panel display comprising a substrate, irregularly-shaped unit pixels, and regularly-shaped unit pixels. The substrate has an outer boundary line, at least one side of which is not a vertical or horizontal line. The irregularly-shaped unit pixels are arranged along the at least one side of the outer boundary line on the substrate. The regularly-shaped unit pixels are placed on the substrate, apart from the at least one side of the outer boundary line.

Each of the regularly-shaped unit pixels comprises 'n' regularly-shaped subpixels, and each of the irregularly-shaped unit pixels comprises 'n' irregularly-shaped subpixels, where 'n' is a positive integer.

An area ratio of the 'n' regularly-shaped subpixels is equal to an area ratio of the 'n' irregularly-shaped subpixels.

The 'n' irregularly-shaped subpixels have different heights and have bases of different lengths, and the greater the heights, the shorter the bases are.

A side of at least one of the 'n' irregularly-shaped subpixels is shorter than a certain side of the 'n' regularly-shaped subpixels.

A side of at least one of the 'n' irregularly-shaped subpixels is longer than a certain side of the 'n' regularly-shaped subpixels.

At least one side of the 'n' irregularly-shaped subpixels conforms to the shape of part of the outer boundary line.

The irregularly-shaped flat-panel display according to the present disclosure can take on various shapes by making at least one side of the outline in any other shape than a vertical line or horizontal line.

The irregularly-shaped flat-panel display according to the disclosure has at least the following advantages. For instance, the flat-panel display according to the disclosure comprises irregularly-shaped unit pixels arranged along an irregularly-shaped outer boundary line, thus creating no artifacts in image quality like a staircase pattern, blur, or a moire pattern on the outer boundary line. Also, the area ratio of the irregularly-shaped subpixels of each of the irregularly-shaped unit pixels arranged along the outer boundary line is equal to the area ratio of the regularly-shaped subpixels contained in each of the regularly-shaped unit pixels, thus causing no change in color or brightness. Further, the irregularly-shaped display device according to the disclosure has no dead zone between the outer boundary line and the pixels where the display function is not available.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DESCRIPTION OF EMBODIMENTS

Figure 1:
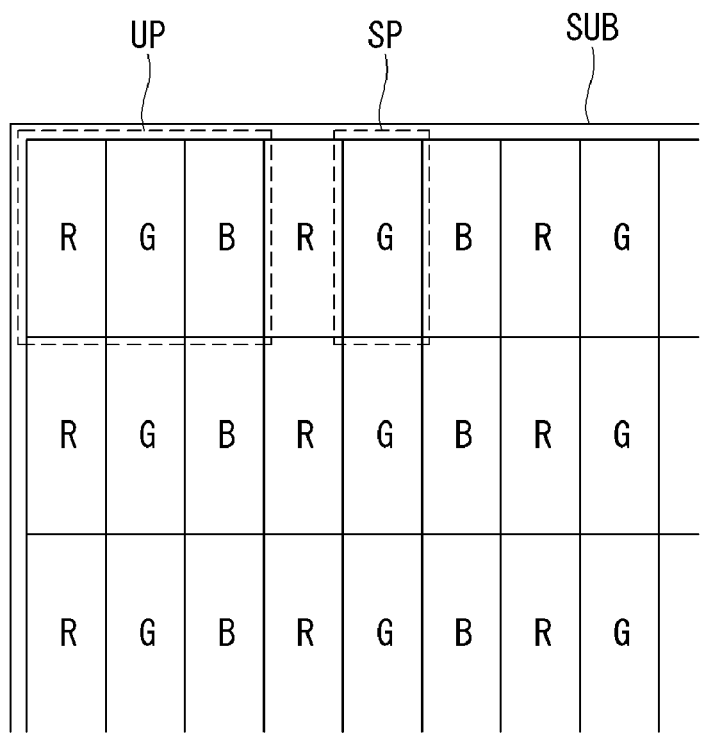
FIG. 1 is a plan view illustrating a structure of a corner portion of a rectangular, regularly-shaped flat-panel display according to a related art.
Figure 2:
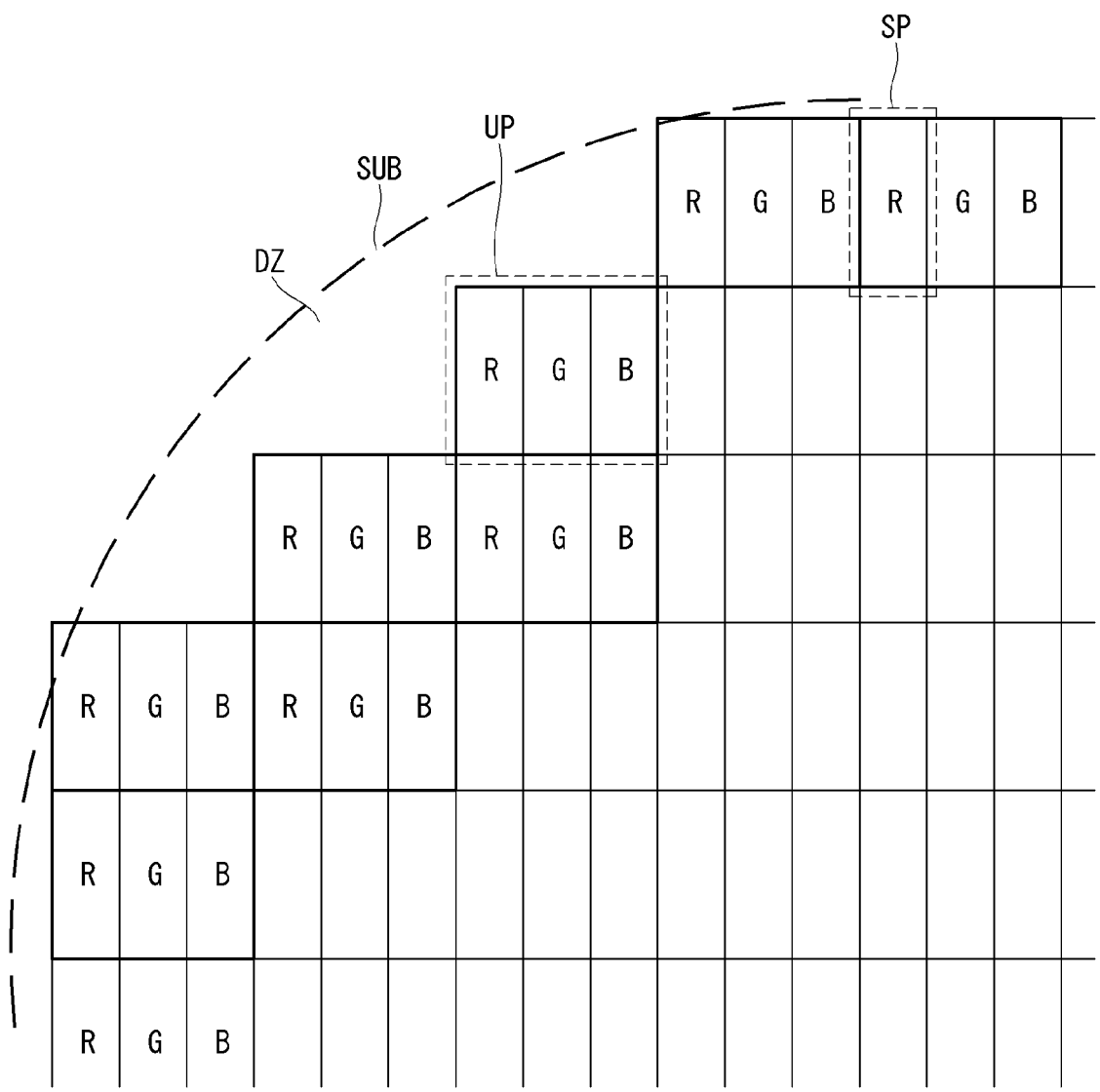
FIG. 2 is a plan view illustrating a structure of an edge portion of a circular, irregularly-shaped flat-panel display having an array of pixels according to a related art.

Various aspects and features of the present disclosure and methods of accomplishing them can be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary embodiments of the present disclosure are merely examples and not limited to those shown in the figures. Like reference numerals denote like elements throughout the specification.

In describing the present disclosure, detailed descriptions of related well-known technologies will be omitted to avoid unnecessarily obscuring the present disclosure. When the terms 'comprise', 'have', 'consist of' and the like are used, other parts can be added as long as the term 'only' is not used. The singular forms can be interpreted as the plural forms unless explicitly stated.

The elements can be interpreted to include an error margin even if not explicitly stated. When the position relation between two parts is described using the terms "on", "over", "under", "next to" and the like, one or more parts can be positioned between the two parts as long as the term "immediately" or "directly" is not used.

It will be understood that, although the terms "first", "second", etc. can be used herein to describe various elements, these elements are not limited by these terms. These terms are used to distinguish one element from another element. The terms and names of elements used herein are chosen for ease of description and can be different from the names of parts used in actual products.

The features of various exemplary embodiments of the disclosure can be coupled or combined with one another either partly or wholly, and can technically interact or work together in various ways. The exemplary embodiments can be carried out independently or in connection with one another.

Hereinafter, embodiments of the disclosure will be described in detail with reference to the accompanying drawings. In the embodiments below, the description of an electroluminescence display will focus on an organic light-emitting display comprising an organic light-emitting material. However, it should be noted that the technical idea of the disclosure is not limited to organic light-emitting displays but also can apply to inorganic light-emitting displays comprising inorganic light-emitting materials. Moreover, other flat-panel displays, as well as electroluminescence displays, can be applied in the manufacture of free-form displays. Further, all components of the flat-panel displays according to all embodiments of the disclosure are operatively coupled and configured. For example, although it may not be described, the flat-panel displays below include therein all the necessary components to operate the displays for displaying images and for other functions. Moreover, describing the flat-panel displays as being of irregular shapes below preferably means that these displays are of all various shapes, e.g., shapes other than the traditional rectangle/square shapes. In addition, even if not specified, all the variations discussed in connection with one embodiment are fully applied and encompassed in all other embodiments of the disclosure discussed below.

First Embodiment

Figure 3:
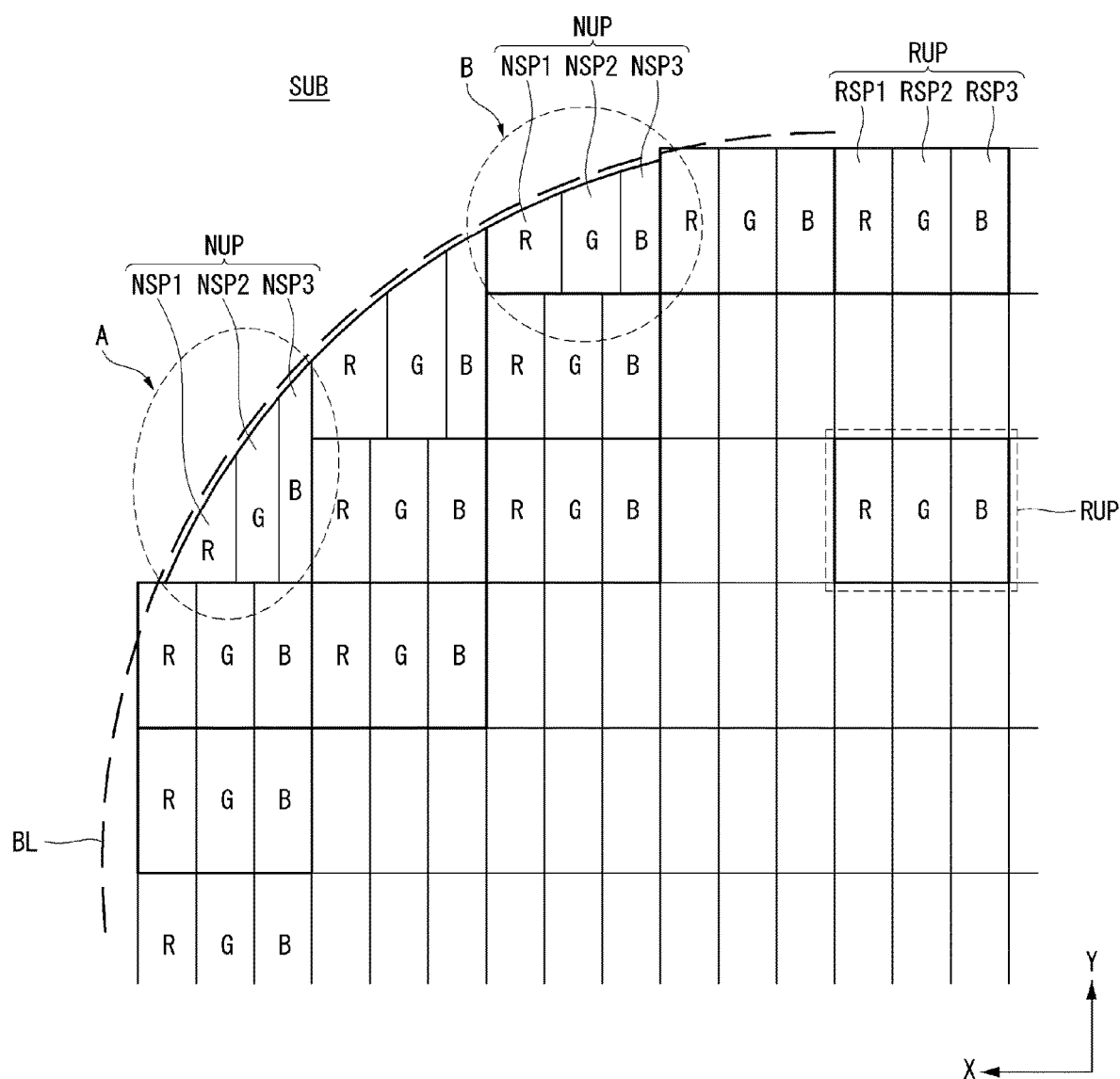
FIG. 3 is a plan view illustrating a structure of an edge portion of a circular display having irregularly-shaped unit pixels according to a first embodiment of the disclosure.

Hereinafter, an irregularly-shaped flat-panel display according to a first embodiment of the disclosure will be described with reference to FIG. 3. In the first embodiment, a flat-panel display with a curved outer boundary line, such as a circular or elliptical flat-panel display, will be described. FIG. 3 is a plan view of a structure illustrating an edge portion of a circular display having irregularly-shaped unit pixels according to the first embodiment of the disclosure.

Referring to FIG. 3, the circular display according to the first embodiment has a circular disk-shaped substrate SUB. Rectangular, regularly-shaped unit pixels RUP and irregularly-shaped unit pixels NUP with at least one curved side are arranged in a matrix on the disk-shaped substrate SUB. The regularly-shaped unit pixels RUP are arranged in a matrix in an area through which a curved outer boundary line BL does not pass. The irregularly-shaped unit pixels NUP are placed adjacent to the regularly-shaped unit pixels RUP, in an area through which the curved outer boundary line BL passes.

The regularly-shaped unit pixels RUP have a square or rectangular shape and are of a given size. For instance, all the regularly-shaped unit pixels RUP arranged across the entire substrate SUB can be equal in size and shape. Each regularly-shaped unit pixel RUP can include 'n' regularly-shaped subpixels, where 'n' is a positive number such as a positive integer. In this example, each regularly-shaped unit pixel RUP comprises three regularly-shaped subpixels. For example, a single regularly-shaped unit pixel RUP can comprise a first regularly-shaped subpixel RSP1, a second regularly-shaped subpixel RSP2, and a third regularly-shaped subpixel RSP3. The first regularly-shaped subpixel RSP1 can be assigned to a red, the second regularly-shaped subpixel RSP2 can be assigned to a green, and the third regularly-shaped subpixel RSP3 can be assigned to a blue. Obviously, other variations are possible. For instance, the regularly-shaped unit pixel RUP can be composed of four regularly-shaped subpixels, e.g., red, green, blue and white subpixels.

All the first regularly-shaped subpixels RSP1, second regularly-shaped subpixels RSP2, and third regularly-shaped subpixels RSP3 arranged across the entire substrate SUB are equal in size and shape. For example, in the regularly-shaped unit pixels RUP, the area ratio (e.g., area size ratio) of the first regularly-shaped subpixel RSP1, second regularly-shaped subpixel RSP2, and third regularly-shaped subpixel RSP3 is 1:1:1. In this case, all the regularly-shaped subpixels RSP arranged across the entire substrate SUB can be equal in size and area.

Each irregularly-shaped unit pixel NUP can include 'n' irregularly-shaped subpixels, where 'n' is a positive number such as a positive integer. In this example, each irregularly-shaped unit pixel NUP comprises three irregularly-shaped subpixels. For example, a single irregularly-shaped unit pixel NUP can comprise a first irregularly-shaped subpixel NSP1, a second irregularly-shaped subpixel NSP2, and a third irregularly-shaped subpixel NSP3. The first irregularly-shaped subpixel NSP1 can be assigned to the red, the second irregularly-shaped subpixel NSP2 can be assigned to the green, and the third irregularly-shaped subpixel NSP3 can be assigned to the blue. Other assignments are possible. Further, each irregularly-shaped unit pixel NUP can have a different number of irregularly-shaped subpixels. For instance, the irregular-shaped unit pixel NUP can be composed of four subpixels, e.g., red, green, blue and white irregularly-shaped subpixels. Moreover, each or one or more of the unit pixels on the substrate can have a combination of regular-shaped subpixel(s) and irregularly-shaped subpixel(s).

The irregularly-shaped unit pixels NUP are arranged in an area through which the curved outer boundary line BL passes. The irregularly-shaped unit pixels NUP have a shape formed as if by partially cutting away the regularly-shaped unit pixels RUP along the outer boundary line BL. The regularly-shaped unit pixels RUP have four edges perpendicular or parallel to one another. In contrast, at least one side of the irregularly-shaped unit pixels NUP has the same shape as a part of the curved outer boundary line BL.

Preferably, the area ratio of the three irregularly-shaped subpixels NSP1, NSP2, and NSP3 that make up an irregularly-shaped unit pixel NUP can be equal to the area ratio of the three regularly-shaped subpixels RSP1, RSP2, and RSP3 that make up a regularly-shaped unit pixel RUP. For example, it is desirable that, if the area ratio of the three regularly-shaped subpixels RSP1, RSP2, and RSP3 that make up the regularly-shaped unit pixel RUP is 1:1:1, the area ratio of the three irregularly-shaped subpixels NSP1, NSP2, and NSP3 that make up the irregularly-shaped unit pixel NUP is 1:1:1.

For example, in an irregularly-shaped unit pixel NUP indicated by a circle 'A', the bases (the sides along the X-axis) of the first irregularly-shaped subpixel NSP1, second irregularly-shaped subpixel NSP2, and third irregularly-shaped subpixel NSP3 have different lengths so that the first irregularly-shaped subpixel NSP1, second irregularly-shaped subpixel NSP2, and third irregularly-shaped subpixel NSP3 are equal in area size. For example, it is desirable that the ratio of the lengths of the bases of the irregularly-shaped subpixels NSP1, NSP2, and NSP3 is the inverse of the ratio of the heights (the sides along the Y-axis) of the irregularly-shaped subpixels NSP1, NSP2, and NSP3 because the height of the second irregularly-shaped subpixel NSP2 is greater than the height of the first irregularly-shaped subpixel NSP1 and the height of the third irregularly-shaped subpixel NSP3 is the greatest.

There are two types of irregularly-shaped unit pixels NUP. The first type is an irregularly-shaped unit pixel NUP, smaller in size than the regularly-shaped unit pixel RUP, that covers all of the three irregularly-shaped subpixels NSP1, NSP2, and NSP3, like the irregularly-shaped unit pixel NUP indicated by the circle 13' in FIG. 3. In this case, the three irregularly-shaped subpixels NSP1, NSP2, and NSP3 are formed as if by partially cutting away a regularly-shaped unit pixel RUP along the outer boundary line BL. In terms of the manufacturing process conditions, the shortest side of the smallest one of the three irregularly-shaped subpixels NSP1, NSP2, and NSP3 is longer than the minimum length allowed for the manufacturing conditions. In short, all of the three irregularly-shaped subpixels NSP1, NSP2, and NSP3 can be covered within the irregularly-shaped unit pixel NUP cut along the outer boundary line BL.

In this case, all of the three irregularly-shaped subpixels NSP1, NSP2, and NSP3 are covered within the irregularly-shaped unit pixel NUP, with at least one side conforming to the shape of a part of the outer boundary line BL. The area ratio of the three irregularly-shaped subpixels NSP1, NSP2, and NSP3 is equal to the area ratio of the three regularly-shaped subpixels RSP1, RSP2, and RSP3.

The other type is an irregularly-shaped unit pixel NUP that does not cover all of the three irregularly-shaped subpixels NSP1, NSP2, and NSP3, like the irregularly-shaped unit pixel NUP indicated by the circle 'A' in FIG. 3. In terms of the manufacturing process conditions, the shortest side of the smallest one of the three irregularly-shaped subpixels NSP1, NSP2, and NSP3 is shorter than the minimum length allowed for the manufacturing conditions.

In this case, the irregularly-shaped unit pixel NUP that does not cover all of the three irregularly-shaped subpixels NSP1, NSP2, and NSP3 is formed in such a way that they extend along an irregularly-shaped subpixel of a neighboring irregularly-shaped unit pixel NUP or a regularly-shaped subpixel of a neighboring regularly-shaped unit pixel RUP. The irregularly-shaped unit pixel NUP indicated by the circle 'A' in FIG. 3 comprises the first irregularly-shaped subpixel NSP1, the second irregularly-shaped subpixel NSP2, and the third irregularly-shaped subpixel NSP3. The first irregularly-shaped subpixel NSP1 has a nearly triangular arc shape. Its height is smaller than the height of the neighboring unit pixel RUP.

Meanwhile, the second irregularly-shaped subpixel NSP2 and the third irregularly-shaped subpixel NSP3 have a nearly trapezoidal shape. Also, the heights of the second and third irregularly-shaped subpixels NSP2 and NSP3 are greater than the height of the neighboring unit pixel RUP. For example, the second and third irregularly-shaped subpixels NSP2 and NSP3 are formed in such a way as if the underlying irregularly-shaped unit pixel extends into the overlying irregularly-shaped unit pixel. The underlying irregularly-shaped subpixels are used since all of the three irregularly-shaped subpixels are not covered within the overlying irregularly-shaped unit pixel.

Second Embodiment

Figure 4:
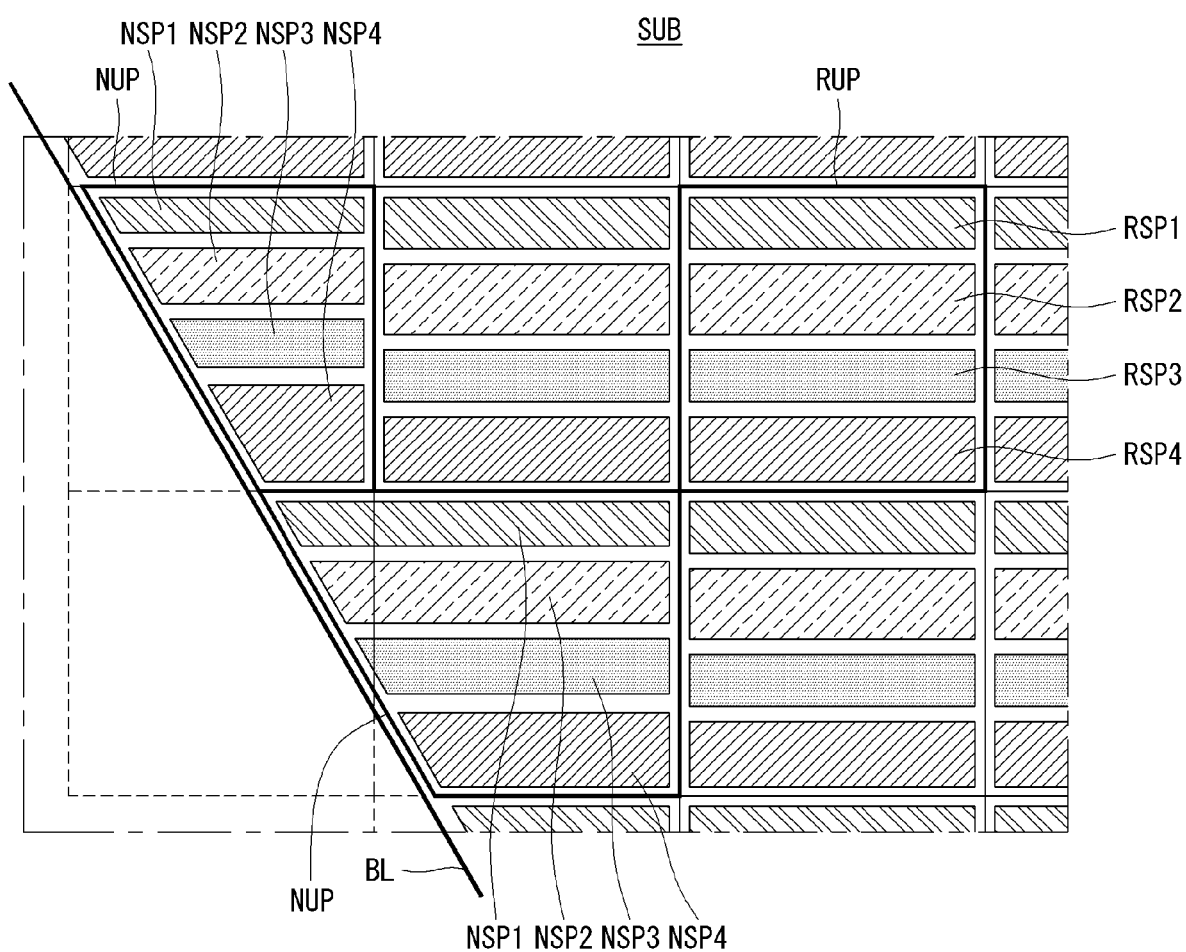
FIG. 4 is a plan view illustrating a structure of an edge portion of a circular display having irregularly-shaped unit pixels that has a non-perpendicular side according to a second embodiment of the disclosure.

Hereinafter, an irregularly-shaped flat-panel display according to a second embodiment of the disclosure will be described with reference to FIG. 4. In the second embodiment, a flat-panel display with a oblique outer boundary line, at least one side of which is not a vertical or horizontal line, will be described. FIG. 4 is a plan view of a structure of an edge portion of a circular display having irregularly-shaped unit pixels that has a non-perpendicular side according to the second embodiment of the disclosure. Herein, the non-perpendicular side refers to a straight line with a slope, not a horizontal or vertical line. In a trapezoid, for example, at least two sides are horizontal or vertical lines parallel to each other, and at least one side can be oblique to the two parallel sides.

Rectangular, regularly-shaped unit pixels RUP and irregularly-shaped unit pixels NUP whose at least one side has an oblique line are formed on a polygonal substrate SUB. The regularly-shaped unit pixels RUP are arranged in a matrix in an area through which an oblique outer boundary line BL does not pass. The irregularly-shaped unit pixels NUP are placed adjacent to the regularly-shaped unit pixels RUP, in an area through which the oblique outer boundary line BL passes.

The regularly-shaped unit pixels RUP have a square or rectangular shape and are of a predetermined size. All the regularly-shaped unit pixels RUP arranged across the entire substrate SUB are equal in size and shape. Each regularly-shaped unit pixel RUP can include 'n' regularly-shaped subpixels, where 'n' is a positive number such as a positive integer. In this example, each regularly-shaped unit pixel RUP comprises four regularly-shaped subpixels. For example, a single regularly-shaped unit pixel RUP can comprise a first regularly-shaped subpixel RSP1, a second regularly-shaped subpixel RSP2, a third regularly-shaped subpixel RSP3, and a fourth regularly-shaped subpixel RSP4. The first regularly-shaped subpixel RSP1 can be assigned to a red, the second regularly-shaped subpixel RSP2 can be assigned to a white, the third regularly-shaped subpixel RSP3 can be assigned to a green, and the third regularly-shaped subpixel RSP3 can be assigned to a blue. Obviously, other variations are possible.

The areas of the four regularly-shaped subpixels RSP1, RSP2, RSP3, and RSP4 that make up a regularly-shaped unit pixel RUP can be different. For example, the area ratio of the first regularly-shaped subpixel RSP1, second regularly-shaped subpixel RSP2, third regularly-shaped subpixel RSP3, and fourth regularly-shaped subpixel RSP4 can be, but not limited to, 1:1.2:0.8:1 or 0.8:1.2:0.9:1.1. Each of the first regularly-shaped subpixels RSP1, second regularly-shaped subpixels RSP2, third regularly-shaped subpixels RSP3, and fourth regularly-shaped subpixels RSP4 arranged on the entire substrate SUB are equal in size and shape. For example, all the first regularly-shaped subpixels RSP1 are equal in size and shape, all the second regularly-shaped subpixels RSP2 are equal in size and shape, all the third regularly-shaped subpixels RSP3 are equal in size and shape, and all the fourth regularly-shaped subpixels RSP4 are equal in size and shape.

Each irregularly-shaped unit pixel NUP can include 'n' irregularly-shaped subpixels, where 'n' is a positive number such as positive integer. In this example, each irregularly-shaped unit pixel NUP comprises four irregularly-shaped subpixels. For example, a single irregularly-shaped unit pixel NUP can comprise a first irregularly-shaped subpixel NSP1, a second irregularly-shaped subpixel NSP2, a third irregularly-shaped subpixel NSP3, and a fourth irregularly-shaped subpixel NSP4. The first irregularly-shaped subpixel NSP1 can be assigned to the red, the second irregularly-shaped subpixel NSP2 can be assigned to the white, the third irregularly-shaped subpixel NSP3 can be assigned to the green, and the fourth irregularly-shaped subpixel NSP4 can be assigned to the blue. Other variations are possible.

The irregularly-shaped unit pixels NUP are arranged in an area through which the oblique outer boundary line BL passes. The irregularly-shaped unit pixels NUP have a shape formed as if by partially cutting away the regularly-shaped unit pixels RUP along the outer boundary line BL. The regularly-shaped unit pixels RUP have four edge perpendicular or parallel to one another. In contrast, at least one side of the irregularly-shaped unit pixels NUP has the same shape as a part of the oblique outer boundary line BL.

Preferably, the area ratio of the four irregularly-shaped subpixels NSP1, NSP2, NSP3, and NSP4 that make up an irregularly-shaped unit pixel NUP can be equal to the area ratio of the four regularly-shaped subpixels RSP1, RSP2, RSP3, and RSP4 that make up a regularly-shaped unit pixel RUP. For example, it is desirable that, if the area ratio of the four regularly-shaped subpixels RSP1, RSP2, RSP3, and RSP4 that make up the regularly-shaped unit pixel RUP is 1:1.2:0.8:1, the area ratio of the four irregularly-shaped subpixels NSP1, NSP2, NSP3, and NSP4 that make up the irregularly-shaped unit pixel NUP is 1:1.2:0.8:1.

For example, in an irregularly-shaped unit pixel NUP, the bases (the sides along the X-axis) and heights (the lengths of the sides along the Y-axis) of the first irregularly-shaped subpixel NSP1, second irregularly-shaped subpixel NSP2, third irregularly-shaped subpixel NSP3, and fourth irregularly-shaped subpixel NSP4 are different from those of the regularly-shaped subpixels RSP1, RSP2, RSP3, and RSP4. This is so that the area ratio of the irregularly-shaped subpixels NSP1, NSP2, NSP3, and NSP4 is equal to the area ratio of the regularly-shaped subpixels RSP1, RSP2, RSP3, and RSP4.

There are two types of irregularly-shaped unit pixels NUP. The first type is an irregularly-shaped unit pixel NUP, smaller in size than the regularly-shaped unit pixel RUP, that covers all of the four irregularly-shaped subpixels NSP1, NSP2, NSP3, and NSP4. In this case, at least one side of the four irregularly-shaped subpixels NSP1, NSP2, NSP3, and NSP4 conforms to the shape of a part of the outer boundary line BL. The area ratio of the four irregularly-shaped subpixels NSP1, NSP2, NSP3, and NSP4 is equal to the area ratio of the four regularly-shaped subpixels RSP1, RSP2, RSP3, and RSP4.

The other type is an irregularly-shaped unit pixel NUP that does not cover all of the four irregularly-shaped subpixels NSP1, NSP2, NSP3, and NSP4. In terms of the manufacturing process conditions, the shortest side of the smallest one of the four irregularly-shaped subpixels NSP1, NSP2, NSP3, and NSP4 is shorter than the minimum length allowed for the manufacturing conditions.

In this case, the irregularly-shaped unit pixel NUP that does not cover all of the four irregularly-shaped subpixels NSP1, NSP2, NSP3, and NSP4 is formed in such a way that they extend along an irregularly-shaped subpixel of a neighboring irregularly-shaped unit pixel NUP or a regularly-shaped subpixel of a neighboring regularly-shaped unit pixel RUP. Moreover, the area ratio of the four irregularly-shaped subpixels NSP1, NSP2, NSP3, and NSP4 is equal to the area ratio of the four regularly-shaped subpixels RSP1, RSP2, RSP3, and RSP4.

While the embodiment of the disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. An irregularly-shaped flat-panel display comprising:
   a substrate with an outer boundary line, at least one side of which is not a vertical or horizontal line;
   irregularly-shaped unit pixels having different shapes arranged along the at least one side of the outer boundary line on the substrate, wherein at least one irregularly-shaped unit pixel among the irregularly-shaped unit pixels includes a plurality of irregularly-shaped subpixels having different shapes; and
   regularly-shaped unit pixels having same shapes placed on the substrate, apart from the at least one side of the outer boundary line, wherein each of the regularly-shaped unit pixels includes a plurality of regularly-shaped subpixels having same shapes disposed inside the outer boundary line,
   wherein the at least one irregularly-shaped unit pixel is disposed directly adjacent to two of the regularly-shaped unit pixels,
   wherein an area ratio of the plurality of regularly-shaped subpixels within at least one regularly-shaped unit pixel among the regularly-shaped unit pixels is equal to an area ratio of the plurality of irregularly-shaped subpixels within the at least one irregularly-shaped unit pixel,
   wherein the at least one irregularly-shaped unit pixel includes an irregularly-shaped subpixel having an extended portion disposed on one side of the at least one irregularly-shaped unit pixel,
   wherein the irregularly-shaped subpixel having the extended portion is disposed directly adjacent to both of a regularly-shaped subpixel within one of the two of the regularly-shaped unit pixels at the one side of the at least one irregularly-shaped unit pixel and an irregularly-shaped subpixel within another one of the irregularly-shaped unit pixels at the one side of the at least one irregularly-shaped unit pixel,
   wherein a regularly-shaped subpixel of a first color is in contact with an irregularly-shaped subpixel of a second color different from the first color, a part of an irregularly-shaped subpixel of the first color, and a regularly-shaped subpixel of a third color different from the first color, and
   wherein a regularly-shaped subpixel of the third color is in contact with the regularly-shaped subpixel of the first color, another part of the irregularly-shaped subpixel of the first color, and a part of an irregularly-shaped subpixel of the third color.

2. The irregularly-shaped flat-panel display of claim 1, wherein the plurality of irregularly-shaped subpixels have different heights and have bases of different lengths, and the greater the heights, the shorter the bases are.

3. The irregularly-shaped flat-panel display of claim 1, wherein a side of at least one of the plurality of irregularly-shaped subpixels is shorter than a certain side of the plurality of regularly-shaped subpixels.

4. The irregularly-shaped flat-panel display of claim 1, wherein a side of at least one of the plurality of irregularly-shaped subpixels is longer than a certain side of the plurality of regularly-shaped subpixels.

5. The irregularly-shaped flat-panel display of claim 1, wherein at least one side of the plurality of irregularly-shaped subpixels conforms to the shape of part of the outer boundary line.

6. The irregularly-shaped flat-panel display of claim 1, wherein the irregularly-shaped unit pixels arranged along the outer boundary line include unit pixels of trapezoid shape.

7. The irregularly-shaped flat-panel display of claim 1, wherein the plurality of irregularly-shaped subpixels include first, second and third irregularly-shaped subpixels and the plurality of regularly-shaped subpixels include first, second and third regularly-shaped subpixels,
   wherein the first irregularly-shaped subpixel is adjacent to all of the first regularly-shaped subpixel and one portion of the second regularly-shaped subpixel,
   wherein the second irregularly-shaped subpixel is adjacent to another portion of the second regularly-shaped subpixel and one portion of the third regularly-shaped subpixel, and
   wherein the third irregularly-shaped subpixel is adjacent to another portion of the third regularly-shaped subpixel.

8. The irregularly-shaped flat-panel display of claim 1, wherein the plurality of irregularly-shaped subpixels include first, second, third and fourth irregularly-shaped subpixels and the plurality of regularly-shaped subpixels include first, second, third and fourth regularly-shaped subpixels,
   wherein the first irregularly-shaped subpixel is adjacent to all of the first regularly-shaped subpixel and one portion of the second regularly-shaped subpixel,
   wherein the second irregularly-shaped subpixel is adjacent to another portion of the second regularly-shaped subpixel and one portion of the third regularly-shaped subpixel,
   wherein the third irregularly-shaped subpixel is adjacent to another portion of the third regularly-shaped subpixel and one portion of the fourth regularly-shaped subpixel, and
   wherein the fourth irregularly-shaped subpixel is adjacent to another portion of the fourth regularly-shaped subpixel.

* * * * *